(12) United States Patent
Muradali et al.

(10) Patent No.: US 6,751,768 B2
(45) Date of Patent: Jun. 15, 2004

(54) HIERARCHICAL CREATION OF VECTORS FOR QUIESCENT CURRENT (IDDQ) TESTS FOR SYSTEM-ON-CHIP CIRCUITS

(75) Inventors: Fidel Muradali, Mountain View, CA (US); Neal C. Jaarsma, Corvallis, OR (US); Chinsong Sul, Mountain View, CA (US); Garrett O'Brien, Sunnyvale, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 394 days.

(21) Appl. No.: 09/997,658

(22) Filed: Nov. 29, 2001

(65) Prior Publication Data

US 2003/0101398 A1 May 29, 2003

(51) Int. Cl.$^7$ ................................. G06F 11/00
(52) U.S. Cl. ........................ 714/738; 714/727
(58) Field of Search ................ 714/738, 724, 714/726, 728, 742, 727, 716, 16; 438/17

(56) References Cited

U.S. PATENT DOCUMENTS

| | | | | | |
|---|---|---|---|---|---|
| 5,987,636 | A | * | 11/1999 | Bommu et al. | 714/738 |
| 6,099,583 | A | * | 8/2000 | Nag | 716/16 |
| 6,173,426 | B1 | * | 1/2001 | Sanada | 714/724 |
| 6,212,655 | B1 | * | 4/2001 | Ghanta et al. | 714/724 |
| 6,385,748 | B1 | * | 5/2002 | Chen et al. | 714/724 |
| 6,461,882 | B2 | * | 10/2002 | Ishida et al. | 438/17 |

* cited by examiner

*Primary Examiner*—David Ton

(57) ABSTRACT

A method is presented for generating test vectors for an integrated circuit. Input test vectors and output test vectors are generated for non-core cell portions of the integrated circuit. Input test vectors and output test vectors are generated for core cell partitions of the integrated circuit. The input test vectors for the non-core cell portions and the input test vectors for the core cell partitions are combined into a single combined input test vector.

12 Claims, 4 Drawing Sheets

HIERARCHICAL CREATION OF VECTORS FOR QUIESCENT CURRENT (IDDQ) TESTS FOR SYSTEM-ON-CHIP CIRCUITS

BACKGROUND

The present invention concerns testing of integrated circuits and pertains particularly to hierarchical creation of vectors for quiescent current tests for system-on-chip circuits.

Integrated circuits are extensively tested by a manufacturer to assure correction functioning and reliability. Quiescent current (IDDQ) tests check for short circuits and other processing faults by loading test vectors into the circuit and monitoring current loads. Abnormal or unexpected current loads can indicate processing faults within the circuit.

Generally, to perform an IDDQ test, a series of test flip-flops located throughout the circuit are loaded with a test vector before each test. A test vector may include hundreds or even thousands of bits, depending upon the complexity of the circuit to be tested. While it would be desirable to perform an exhaustive test of the circuit using every possible test vector value, the test vector size and the time required to test the circuit using each test vector make such testing impractical. Therefore, it is important to generate a set of test vectors that will efficiently test the circuit and have a high probability of detecting any faults.

Software programs are typically used to generate test vectors for IDDQ tests. The software programs receive as input a file describing the circuitry of the circuit and produce a set of test vectors that will test the circuit. However, as circuits increase in complexity and the number of components within a circuit increases, the processing power and time required to generate test vectors increases. It is desirable, therefore, to develop more efficient ways to generate test vectors.

SUMMARY OF THE INVENTION

In accordance with the preferred embodiment of the present invention, a method is presented for generating test vectors for an integrated circuit. Input test vectors and output test vectors are generated for non-core cell portions of the integrated circuit. Input test vectors and output test vectors are generated for core cell partitions of the integrated circuit. The input test vectors for the non-core cell portions and the input test vectors for the core cell partitions are combined into a single combined input test vector.

DESCRIPTION OF THE PREFERRED EMBODIMENT

Figure 1:
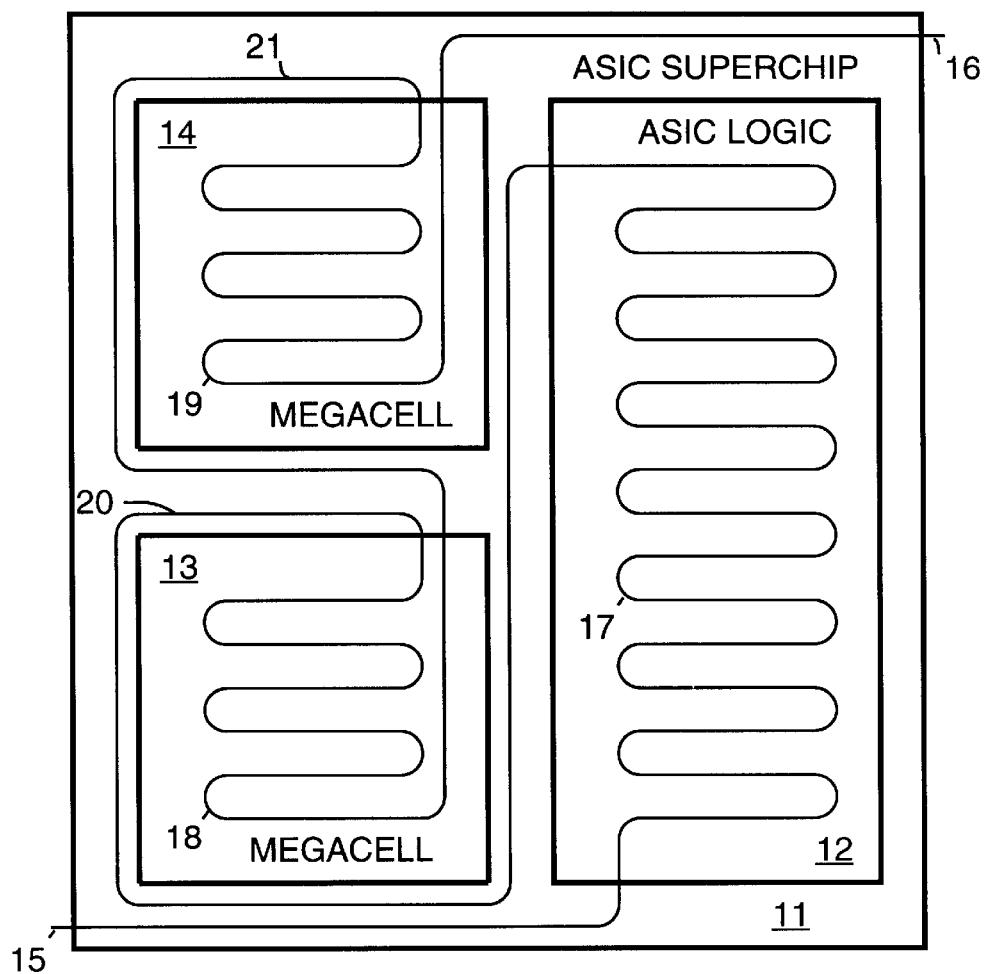
FIG. 1 illustrates use of a scan chain on a super chip in accordance with the prior art.

FIG. 1 shows a scan chain on a super chip 11. Super chip 11 can also be referred to as a system on a chip (SOC). The scan chain includes a scan input 15, an application specific integrated circuit (ASIC) chain 17 within ASIC logic 12, a megacell chain 18 within megacell 13, a wrapper chain 20 outside megacell 13, a megacell chain 19 within megacell 14, a wrapper chain 21 outside megacell 14, and a scan output 16.

The scan chain includes a series of scan cells. Each scan cell includes a flip-flop into which may be loaded a bit value. The wrapper chains include series of wrapper cells. A wrapper cell is a basic scan cell modified to include extra mode logic. Input stimulus (control values) may be serially entered into the scan cells of the scan chain via scan input 15. Output response (observe values) may be retrieved serially from the scan cells via scan output 16.

Figure 2:
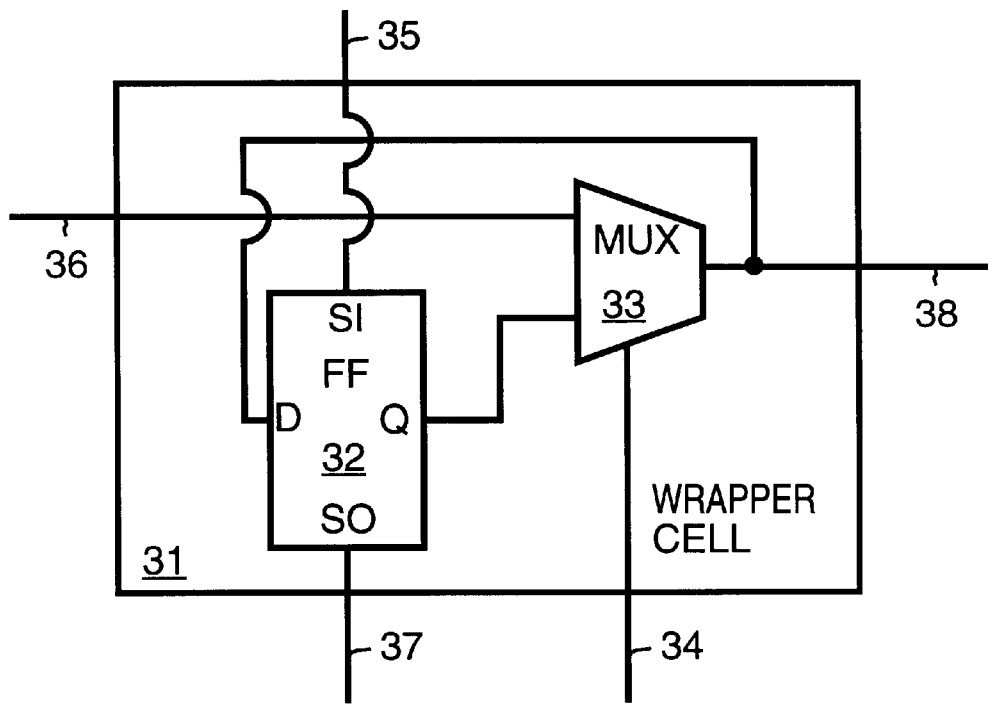
FIG. 2 is a block diagram of a wrapper cell in accordance with the prior art.

For example, FIG. 2 shows an example of a wrapper cell 31 used within wrapper chain 20. Wrapper cell 31 includes a serial input 35 via which a control value may be loaded into a flip-flop 32. Flip-flop 32 is a basic scan cell with additional logic. Wrapper cells wrap a core cell and thus provide direct access from chip pins to the core cell under test via scan ports. Wrapper cell 31 includes a serial output 37 by which a response value may be retrieved from flip-flop 32.

When ASIC super chip 41 is in normal operating mode or when wrapper cell 31 is used to observe data output from megacell 13 to a wrapper cell input 36, a control signal is placed on control line 34 that causes a multiplexer 33 to connect wrapper cell input 36 to a wrapper cell output 38. When wrapper cell 31 is used to be a source of control data to be input to megacell 13 via a wrapper cell output 38, a second control signal is placed on control line 34 that causes multiplexer 33 to connect the Q output of flip-flop 32 to wrapper cell output 38.

Quiescent current (IDDQ) tests are run for a super chip as a single entity. In the present invention, IDDQ test sets are created for each cell partition or "core" of the circuit. For example, for ASIC super chip 11 shown in FIG. 1, separate IDDQ test sets are developed for each of megacell 14, megacell 13 and ASIC logic 12. These test sets are also referred to as test vectors or vectors.

An IDDQ-safe state is created by loading a test vector to all flip-flops in the scan chain. The present invention provides a method for merging IDDQ test vectors into a single vector used for all logic partitions within the super chip.

In the method, test vectors for wrapped cells are integrated with test vectors for top-level ASIC circuitry in order to generate a single test vector. Each test vector has two parts. A first part is input stimulus. A second part is output response. Therefore each flip flop (FF) in the scan chain has 2 bit assignments per vector. The first assignment is input stimulus ("control"). The second assignment is output response ("observe").

Figure 3:
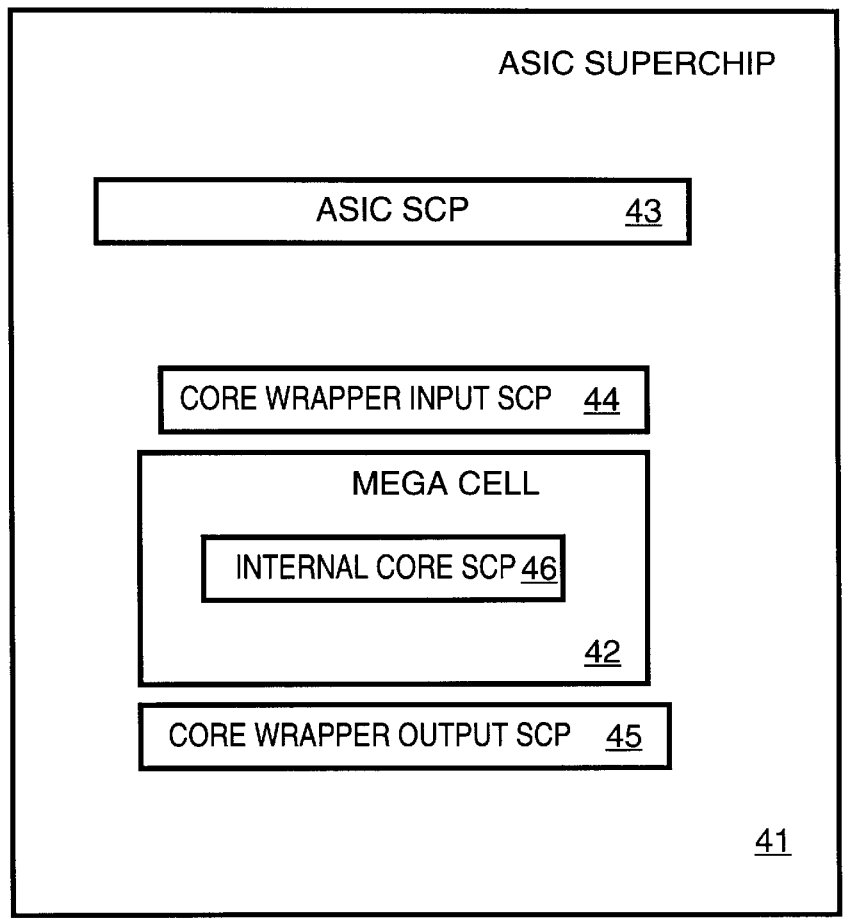
FIG. 3 is a simplified diagram that shows categories of scan chain portions on a super chip.

FIG. 3 is a simplified diagram that shows categories of scan chain portions on an ASIC super chip 41. An ASIC scan chain portion (SCP) 43 can be used for controlling input and observing output ASIC logic. An internal core SCP 46 can be used for controlling input and observing output logic within megacell 42. A core wrapper input SCP 44 can be used for controlling input to megacell 42 and for observing output from ASIC logic. A core wrapper output SCP 45 can be used for observing output from megacell 42 and controlling input to ASIC logic.

When generating test vectors for ASIC logic, the test vector uses three scan chain portions. ASIC SCP 43 is used for controlling inputs and observing outputs of ASIC logic. Core wrapper input SCP 44 is used for observing outputs of ASIC logic. Core wrapper output SCP 45 is used for controlling inputs to ASIC logic.

When generating test vectors for megacells, the test vector uses three scan chain portions. Internal core SCP 46 is used for controlling inputs and observing outputs of logic within megacell 42. Core wrapper input SCP 44 is used for controlling the inputs of megacell 42. Core wrapper output SCP 45 is used for observing the outputs of megacell 42.

When combining test vectors to make a single IDDQ vector, ASIC SCP 43 is used for controlling inputs of ASIC logic. Core wrapper input SCP 44 is used for controlling the inputs of megacell 42. Core wrapper output SCP 45 is used for controlling inputs to ASIC logic. Internal core SCP 46 is used for controlling inputs of logic within megacell 42. This sets up a proper IDDQ FF state for ASIC super chip 41.

When evaluating output response after an IDDQ test, ASIC SCP 43 is used for observing outputs of ASIC logic. Core wrapper input SCP 44 is used for observing outputs of ASIC logic. Core wrapper output SCP 45 is used for observing the outputs of megacell 42. Internal core SCP 46 is used for observing outputs of logic within megacell 42.

Figure 4:
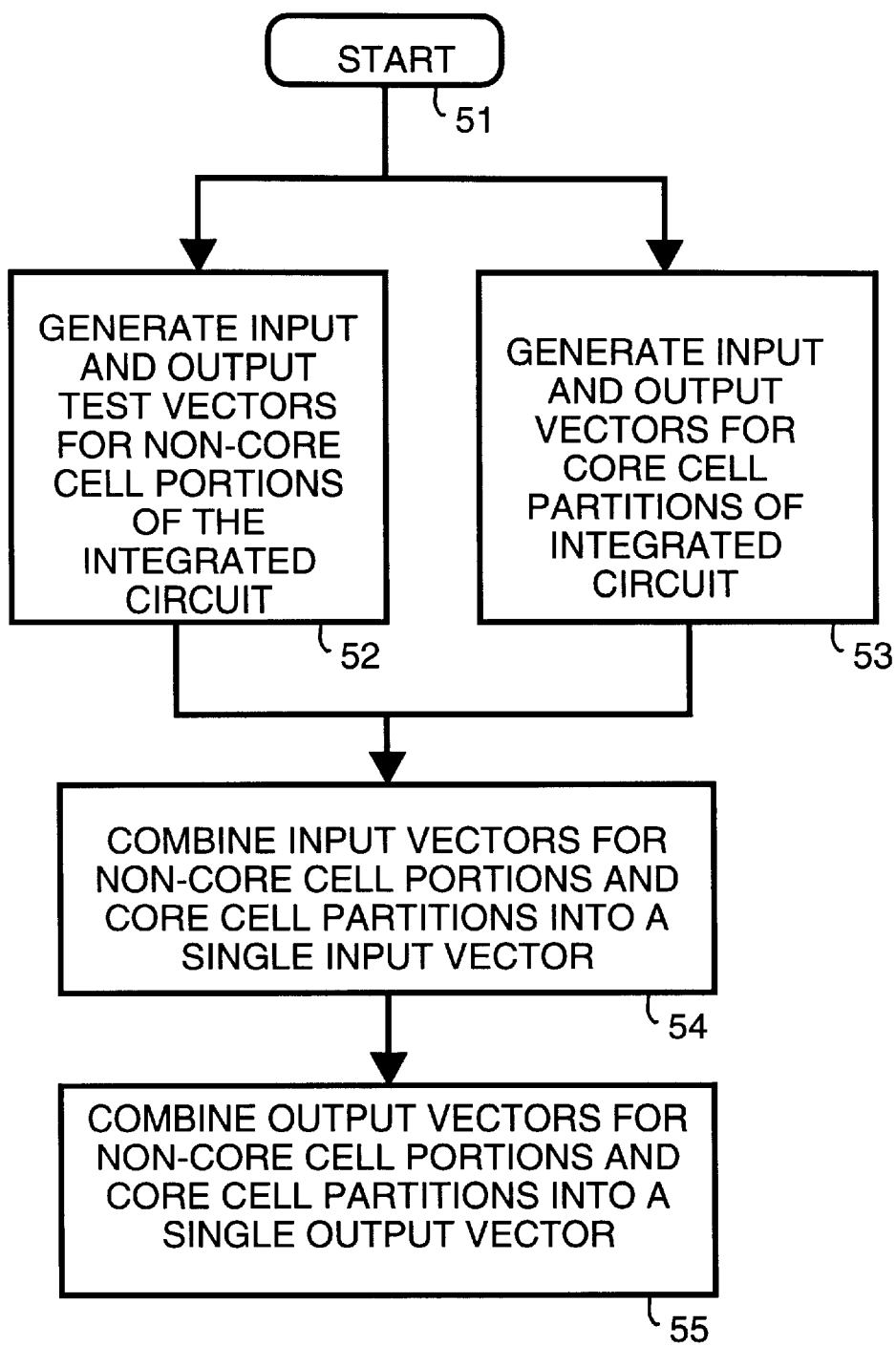
FIG. 4 summarizes generation of IDDQ test vectors on an integrated circuit in accordance with a preferred embodiment of the present invention.

FIG. 4 shows two levels of hierarchy. Megacell 42 may contain additional levels of hierarchy. For any additional levels of hierarchy, vectors are created in the same way as set out above.

FIG. 4 summarizes generation of IDDQ test vectors on integrated circuit. In a step 51, the method starts. In a step 52 input and output vectors are generated for non-core cell portions of the integrated circuit. In a step 53, input and output vectors are generated for core cell partitions of the integrated circuit. Step 53 can be performed before, after or concurrent with step 52 provided both step 52 and step 53 are performed before step 54. In step 54, input vectors for non-core cell portions and input vectors for the core cell partitions are combined into a single input vector.

The values for the output test vectors are not included in the single combined input test vector. When a total number of bit values of output test vectors generated in step (52) is greater than a total number of bit values of input test vectors generated in step (53), bit values from the input test vectors generated in step (53) are replicated to compensate. Likewise, when a total number of bit values of output test vectors generated in step (53) is greater than a total number of bit values of input test vectors generated in step (52), bit values from the input test vectors generated in step (52) are replicated to compensate.

In a step 55, output vectors for non-core cell portions and output vectors for the core cell partitions are combined into a single output vector.

The foregoing discussion discloses and describes merely exemplary methods and embodiments of the present invention. As will be understood by those familiar with the art, the invention may be embodied in other specific forms without departing from the spirit or essential characteristics thereof. Accordingly, the disclosure of the present invention is intended to be illustrative, but not limiting, of the scope of the invention, which is set forth in the following claims.

We claim:

1. A method for generating test vectors for an integrated circuit, the method comprising the following steps:

(a) generating input test vectors and output test vectors for non-core cell portions of the integrated circuit;

(b) generating, input test vectors and output test vectors for core cell partitions of the integrated circuit; and, (c) combining the input test vectors for the non-core cell portions and the input test vectors for the core cell partitions into a single combined input test vector, so that at least a subset of values for the output test vectors generated in step (a) and step (b) are not included in the single combined input test vector.

2. A method as in claim 1 additionally comprising the following step:

(d) combining the output test vectors for the non-core cell portions and the output test vectors for the core cell partitions into a single combined output test vector.

3. A method as in claim 1 wherein the integrated circuit is a system on a chip integrated circuit.

4. A method as in claim 1 additionally comprising the following step:

(d) performing an quiescent current (IDDQ) test using the single combined input test vector.

5. A method as in claim 1 additionally comprising the following steps:

(d) combining the output test vectors for the non-core cell portions and the output test vectors for the core cell partitions into a single combined output test vector; and, (e) performing a quiescent current (IDDQ) test using the single combined input test vector.

6. A method as in claim 1 additionally comprising the following steps:

(d) combining the output test vectors for the non-core cell portions and the output test vectors for the core cell partitions into a single combined output test vector;

(e) performing a quiescent current (IDDQ) test using the single combined input test vector; and, (f) using the single combined output test vector as a check on the IDDQ test.

7. A method as in claim 1 wherein in step (a) the non-core cell portions are application specific integrated circuit (ASIC) logic portions of the integrated circuit.

8. A method as in claim 1 wherein in step (c) the core cell partitions are megacells.

9. A method as in claim 1 additionally comprising the following step:

(d) performing a quiescent current (IDDQ) test using the single combined input test vector, including the following substep:
serially loading the single combined input test vector into a scan chain on the integrated circuit.

10. A method as in claim 1 additionally comprising the following steps:

(d) combining the output test vectors for the non-core cell portions and the output test vectors for the core cell partitions into a single combined output test vector;

(e) performing a quiescent current (IDDQ) test using the single combined input test vector, including the following substep:
serially loading the single combined input test vector into a scan chain on the integrated circuit; and, (f) using the single combined output test vector as a check on the IDDQ test, including the following substep:
serially off-loading the single combined input test vector from the scan chain on the integrated circuit.

11. A method as in claim 1 wherein step (c) includes the following substep:

(c.1) when a total number of bit values of output test vectors generated in step (a) is greater than a total number of bit values of input test vectors generated in step (b), replicating bit values from the input test vectors generated in step (b) until a total number bit values of the input test vectors generated in step (b) and modified in step (c) is equal to the total number of bit values of output test vectors generated in step (a).

12. A method as in claim 1 wherein step (c) includes the following substep:

(c.1) when a total number of bit values of output test vectors generated in step (b) is greater than a total number of bit values of input test vectors generated in step (a), replicating bit values from the input test vectors generated in step (a) until a total number bit values of the input test vectors generated in step (a) and modified in step (c) is equal to the total number of bit values of output test vectors generated in step (b).

* * * * *